United States Patent
Takabe et al.

(10) Patent No.: US 7,589,450 B2
(45) Date of Patent: Sep. 15, 2009

(54) ACTUATOR DEVICE, LIQUID-JET HEAD AND LIQUID-JET APPARATUS

(75) Inventors: Motoki Takabe, Nagano-ken (JP); Koji Sumi, Nagano-ken (JP); Naoto Yokoyama, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 41 days.

(21) Appl. No.: 11/482,689

(22) Filed: Jul. 10, 2006

(65) Prior Publication Data

US 2007/0007860 A1    Jan. 11, 2007

(30) Foreign Application Priority Data

Jul. 8, 2005   (JP) ............................. 2005-200923
Jun. 1, 2006   (JP) ............................. 2006-153922

(51) Int. Cl.
*H01L 41/00*   (2006.01)
*H02N 2/00*    (2006.01)

(52) U.S. Cl. ....................... 310/311; 310/357; 310/358; 310/363; 310/364; 310/365

(58) Field of Classification Search ................. 310/311, 310/29, 216, 13, 324, 366, 326, 24
See application file for complete search history.

(56) References Cited

U.S. PATENT DOCUMENTS

| | | | | |
|---|---|---|---|---|
| 5,453,294 | A * | 9/1995 | Ogi et al. ..................... | 427/100 |
| 5,798,903 | A * | 8/1998 | Dhote et al. ............. | 361/321.4 |
| 6,307,214 | B1 * | 10/2001 | Ohtani et al. ................. | 257/59 |
| 6,387,225 | B1 * | 5/2002 | Shimada et al. ........ | 204/192.18 |
| 6,555,886 | B1 * | 4/2003 | Xu et al. ..................... | 257/410 |
| 6,707,230 | B2 * | 3/2004 | Smith et al. ............ | 310/316.01 |

(Continued)

FOREIGN PATENT DOCUMENTS

EP    1137078 A    9/2001

(Continued)

OTHER PUBLICATIONS

Fan et al., Perovskite Structure Development and Electrical Properties of PZN Based Thin Films, Apr. 26, 2001, Journal of the European Ceramic Society 22 (2002), pp. 1699-1704.*

(Continued)

*Primary Examiner*—Jeffrey Donels
*Assistant Examiner*—Christopher Uhlir
(74) *Attorney, Agent, or Firm*—Sughrue Mion, PLLC

(57) ABSTRACT

An actuator device includes: a layer provided on a single crystal silicon (Si) substrate, and made of silicon dioxide ($SiO_2$); at least one buffer layer provided on the layer made of silicon dioxide ($SiO_2$); a base layer provided on the buffer layer, and made of lanthanum nickel oxide (LNO) having the (100m) plane orientation; and a piezoelectric element. The piezoelectric element includes: a lower electrode provided on the base layer, and made of platinum (Pt) having the (100) plane orientation; a piezoelectric layer made of a ferroelectric layer whose plane orientation is the (100) orientation, the piezoelectric layer formed on the lower electrode by epitaxial growth where a crystal system of at least one kind selected from a group consisting of a tetragonal system, a monoclinic system and a rhombohedral system dominates the other crystal systems; and an upper electrode provided on the piezoelectric layer.

9 Claims, 7 Drawing Sheets

U.S. PATENT DOCUMENTS

| | | | |
|---|---|---|---|
| 6,717,337 B2 * | 4/2004 | Howarth et al. | 310/369 |
| 6,946,030 B2 * | 9/2005 | Schwertfeger et al. | 117/200 |
| 7,083,270 B2 * | 8/2006 | Torii et al. | 347/68 |
| 2001/0013311 A1 * | 8/2001 | Migita et al. | 117/1 |
| 2002/0126185 A1 | 9/2002 | Murai | |
| 2003/0016895 A1 * | 1/2003 | Holm et al. | 385/2 |
| 2003/0026515 A1 * | 2/2003 | Barenburg et al. | 385/14 |
| 2003/0222943 A1 * | 12/2003 | Sumi | 347/68 |
| 2004/0125176 A1 * | 7/2004 | Kobayashi et al. | 347/68 |
| 2005/0018019 A1 * | 1/2005 | Miyazawa et al. | 347/68 |
| 2005/0082943 A1 * | 4/2005 | Kubota et al. | 310/311 |
| 2005/0109456 A1 * | 5/2005 | Yokouchi et al. | 156/307.1 |
| 2005/0127780 A1 * | 6/2005 | Ifuku et al. | 310/311 |
| 2005/0179342 A1 * | 8/2005 | Higuchi et al. | 310/324 |

FOREIGN PATENT DOCUMENTS

| | | | |
|---|---|---|---|
| JP | 10-081016 A | | 3/1998 |
| JP | 2001-080995 A | * | 3/2001 |
| JP | 2001-274472 A | * | 10/2001 |
| JP | 2002-370354 A | * | 12/2002 |
| JP | 2004-066600 A | | 3/2004 |
| JP | 2005-203613 A | | 7/2005 |

OTHER PUBLICATIONS

"Effect of $LaNiO_3$ buffer layer on properties of $Pb(Zr, Ti)O_3$ thin films", Gen-Shui Wang, et al., Journal of Functional Materials and Devices, vol. 10, No. 3, Sep. 2004, pp. 294-298.

* cited by examiner of the invention is to provide an actuator device including a piezoelectric layer formed of crystals whose fluctuations in a polarization direction are suppressed, and which are in an undistorted state; and

ACTUATOR DEVICE, LIQUID-JET HEAD AND LIQUID-JET APPARATUS

The entire disclosure of Japanese Patent Application Nos. 2005-200923 filed Jul. 8, 2005 and 2006-153922 filed Jun. 1, 2006 is expressly incorporated by reference herein.

BACKGROUND

1. Technical Field

The present invention relates to: an actuator device using piezoelectric elements including a piezoelectric layer whose fluctuations in a polarization direction are suppressed; and a liquid-jet head and a liquid-jet apparatus each including the actuator device as a driving source for ejecting liquid droplets.

2. Related Art

An actuator device including piezoelectric elements caused to displace by application of a voltage is mounted, for example, on a liquid-jet head or the like, which ejects liquid droplets. As a liquid-jet apparatus including the liquid-jet head as described above, there can be cited, for example, an ink-jet recording apparatus including an ink-jet recording head provided with: a plurality of pressure generating chambers which generate pressures for ejecting ink droplets by means of a pressure generation means such as piezoelectric elements, heating elements; a common reservoir which supplies ink to each of the pressure generating chambers; and nozzle orifices communicating with the respective pressure generating chambers. In this ink-jet recording apparatus, ink droplets are ejected from the nozzle orifices when ejection energy is applied on ink in the pressure generating chambers communicating with nozzles that correspond to a printing signal.

The ink-jet recording heads fall into two broad categories: a type having a configuration, as the pressure generation means as described above, where heating elements, such as resistance wires, for generating Joule heat by a driving signal are provided inside the pressure generating chambers, and ink droplets are ejected from nozzle orifices by means of bubbles generated by the heating elements; and a piezoelectric vibration type having a configuration where a part of the pressure generating chamber is configured of a vibrating plate, and by deforming this vibrating plate by means of piezoelectric elements, ink droplets are ejected from nozzle orifices.

Additionally, as ink-jet recording heads of the piezoelectric-vibration type, the following two types have been put to practical use: one using a piezoelectric actuator of a longitudinal vibration mode which causes the piezoelectric elements to extend and contract in an axial direction thereof; and the other using a piezoelectric actuator of a flexural vibration mode.

Here, the piezoelectric element is formed by sequentially laminating a lower electrode, a piezoelectric layer and an upper electrode on a surface of one side of a single crystal silicon substrate. At this occasion, crystallinity of the lower electrode comes to have the same orientation as the plane orientation of the single crystal silicon substrate by receiving influence of the plane orientation of the single crystal silicon substrate which is a base thereunder. Additionally, crystallinity of the piezoelectric layer comes to have the same orientation as the plane orientation of the lower electrode by receiving influence of a base thereunder.

Note that, in practice, on the surface of the one side of the single crystal silicon substrate, an amorphous (non-crystal) layer such as, for example, an oxide silicon layer is beforehand provided as abase under the lower electrode. For this reason, the crystallinity of the lower electrode comes to show an orientation having the least energy for crystal growth because it is substantially free from the influence of the crystal orientation of the single crystal silicon substrate. Specifically, when the lower electrode on the amorphous layer is made of, for example, platinum (Pt) and the like, the (111) plane orientation of the substrate is oriented in a direction normal to the single crystal silicon substrate. Then, when the piezoelectric layer is formed on the lower electrode like this, the plane orientation of the piezoelectric layer becomes the (111) orientation.

Additionally, the pressure generating chambers are formed by anisotropically etching a surface of the other side of the single crystal silicon substrate, which is reverse to a surface having the piezoelectric elements. In order to form the pressure generating chambers by thus utilizing anisotropical etching, it is necessary in general to use a single crystal silicon substrate whose plane orientation is the (110) orientation.

However, in order to substantially enhance piezoelectric characteristics of the piezoelectric layer, it is preferable that the plane orientation of the piezoelectric layer should have the (100) orientation when a crystal system thereof is a rhombohedral system. Although, by using the single crystal silicon substrate whose plane orientation is the (110) orientation, an attempt to cause the piezoelectric layer to have the (100) orientation has been made by forming the silicon oxide layer on the surface of one side of the single crystal silicon substrate, and then forming the lower electrode of the (100) orientation on the silicon oxide layer, it has been very difficult to cause the lower electrode to have the (100) orientation.

In response, for example, the following have conventionally been performed: after a lower electrode which is made of platinum, iridium and the like, and which has the (111) orientation, is formed as the lower electrode, titanium (a crystalline type) serving as orientation control of the piezoelectric layer is formed on the lower electrode, and the piezoelectric layer is formed on this titanium. By performing this method, the piezoelectric layer grows freely because presence of titanium as a base causes the piezoelectric layer to be free from the influence of the lower electrode. Therefore, a majority of the plane orientation thereof becomes the (100) orientation. Thereby, the pressure generating chambers can be easily formed by utilizing anisotropical etching, and concurrently a majority of the piezoelectric layer can be oriented in the (100) plane orientation (refer to Patent Document 1).

However, even if titanium serving as orientation control of the piezoelectric layer is provided, the piezoelectric layer is formed through free growth, whereby there exists a problem that the plane orientation thereof cannot be completely the (100) orientation because fluctuations in orientation occur in the piezoelectric layer. Additionally, since strict process management is required in order to form titanium on the lower electrode, manufacturing processes become complicated, whereby there exists a problem that a manufacturing efficiency is low.

Note that, obviously, problems of these kinds occur not only in ink-jet recording heads, but also in other liquid-jet heads.

[Patent Document 1] JP-A-2001-274472 Official Gazette (Scope of claims and other parts)

SUMMARY

An advantage of some aspects of the invention is to provide: an actuator device including a piezoelectric layer formed of crystals whose fluctuations in a polarization direction are suppressed, and which are in an undistorted state; and a liquid-jet head and a liquid-jet apparatus each including the actuator device as a driving source for ejecting liquid droplets.

A first aspect of the invention for solving the abovementioned problems is present in an actuator device characterized by including: a layer provided on a single crystal silicon (Si) substrate, the layer made of silicon dioxide ($SiO_2$); at least one buffer layer provided on the layer made of silicon dioxide ($SiO_2$); and a base layer provided on the buffer layer, the base layer made of lanthanum nickel oxide (LNO) having the (100) plane orientation. The actuator device is also characterized by further including a piezoelectric element composed of: a lower electrode provided on the base layer, the lower electrode made of platinum (Pt) having the (100) plane orientation; a piezoelectric layer made of a ferroelectric layer having the (100) plane orientation, and concurrently formed on the lower electrode by epitaxial growth where a crystal system of at least one kind selected from the group consisting of a tetragonal system, a monoclinic system and a rhombohedral system dominates the other crystal systems; and an upper electrode provided on the piezoelectric layer.

According to the first aspect, an actuator device becomes one whose fluctuations in a polarization direction are suppressed, and which is in an undistorted state, because the plane orientation of the lower electrode made of platinum (Pt) is controlled to be the (100) orientation by growing the lower electrode made of platinum (Pt) on the base layer made of lanthanum nickel oxide (LNO) having the (100) plane orientation and the piezoelectric layer can be grown to have the undistorted (100) plane orientation by further epitaxially growing the piezoelectric layer on the lower electrode made of platinum (Pt) having the (100) plan orientation.

A second aspect of the invention is present in the actuator device according to the first aspect, characterized in that the buffer layer is a layer made of at least zirconium oxide ($ZrO_2$).

According to the second aspect, durability of the actuator device is more reliably enhanced because, while preserving stiffness as a vibration plate, the buffer layer made of zirconium oxide ($ZrO_2$) can prevent lead (Pb) from being diffused to silicon dioxide ($SiO_2$) even when lead (Pb) is eluted from the piezoelectric layer.

A third aspect of the invention is present in the actuator device according to the first aspect, characterized in that the buffer layer includes: the layer made of zirconium oxide ($ZrO_2$); and a layer for enhancing adherence to the base layer.

According to the third aspect, while preserving stiffness as a vibration plate, the buffer layer made of zirconium oxide ($ZrO_2$) can prevent lead (Pb) from being diffused to silicon dioxide ($SiO_2$) even when lead (Pb) is eluted from the piezoelectric layer. Furthermore, adherence between the layer made of zirconium oxide ($ZrO_2$) and the base layer made of lanthanum nickel oxide (LNO) can be enhanced by providing the layer for enhancing adherence to the base layer.

A fourth aspect of the invention is present in the actuator device according to the first aspect, characterized in that the buffer layer is a layer which prevents lead (Pb) in the piezoelectric layer from being diffused to silicon dioxide ($SiO_2$).

According to the fourth aspect, durability of the actuator device is more reliably enhanced because the buffer layer made of zirconium oxide ($ZrO_2$) can prevent lead (Pb) from being diffused to silicon dioxide ($SiO_2$) even when lead (Pb) is eluted from the piezoelectric layer.

A fifth aspect of the invention is present in the actuator device according to any one of the first to fourth aspects, characterized in that the piezoelectric layer is any one of a single crystal ferroelectric thin film and a polycrystal ferroelectric thin film. The single crystal ferroelectric thin film is made of any one kind selected from: lead zirconate titanate (PZT); barium titanate ($BaTiO_3$); barium strontium titanate (($Ba,Sr$)$TiO_3$); a solid solution of lead magnesium niobate (PMN) and lead titanate (PT); and a relaxor ferroelectric. The polycrystal ferroelectric thin film has no in-plane orientation and is oriented in a direction normal to the substrate.

According to the fifth aspect, an electric-field-induced distortion sufficient for practical use can be obtained.

A sixth aspect of the invention is present in the actuator device according to the fifth aspect, characterized in that the above-referenced one of the single crystal ferroelectric thin film and the polycrystal ferroelectric thin film has point defects.

According to the sixth aspect, a large distortion can be obtained with a small voltage.

A seventh aspect of the invention is present in the actuator device according to any one of the first to sixth aspects, characterized in that the single crystal silicon (Si) substrate is a single crystal silicon (Si) substrate whose plane orientation is the (110) orientation.

According to the seventh aspect, even though the plane orientation of the substrate is the (110) orientation, the plane orientation of the lower electrode becomes the (100) orientation by including the base layer having the (100) plane orientation and being made of lanthanum nickel oxide (LNO).

An eighth aspect of the invention is present in a liquid-jet head characterized by including the actuator device according to any one of the first to seventh aspects as a pressure generation means for generating, pressures for ejecting, from nozzle orifices, liquid inside the pressure generating chambers.

According to the eighth aspect, a liquid-jet head becomes the one provided with the actuator device, which is excellent in piezoelectric characteristics, as the pressure generation means.

A ninth aspect of the invention is present in a liquid-jet apparatus characterized by including the liquid-jet head according to the eighth aspect.

According to the ninth aspect, a liquid-jet apparatus becomes the one including the liquid-jet head provided with the actuator device, which is excellent in piezoelectric characteristics, as the pressure generation means.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinbelow, the invention will be described in detail based on an embodiment.

Figure 1:
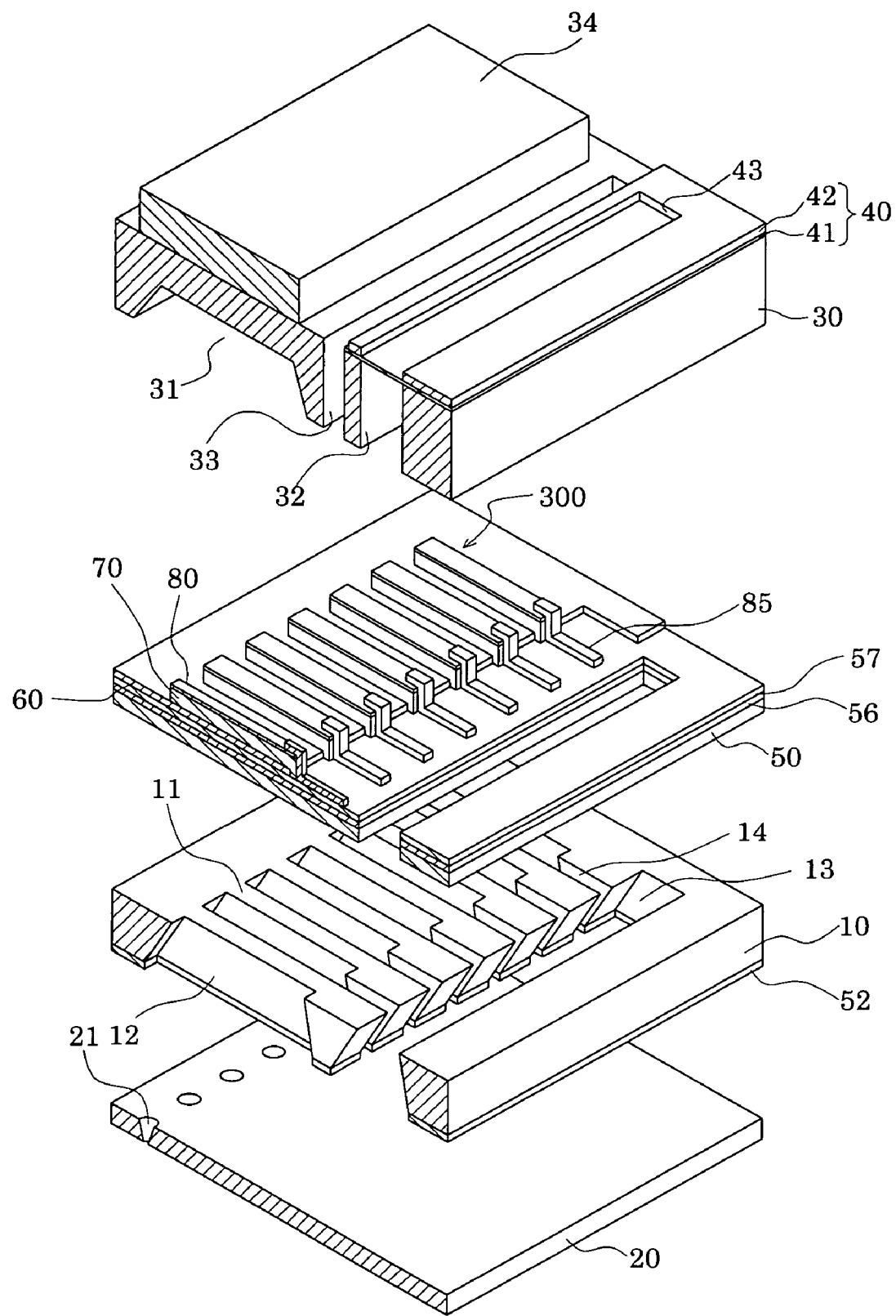
FIG. 1 is an exploded perspective view of a liquid-jet head according to one embodiment.
Figure 2A:
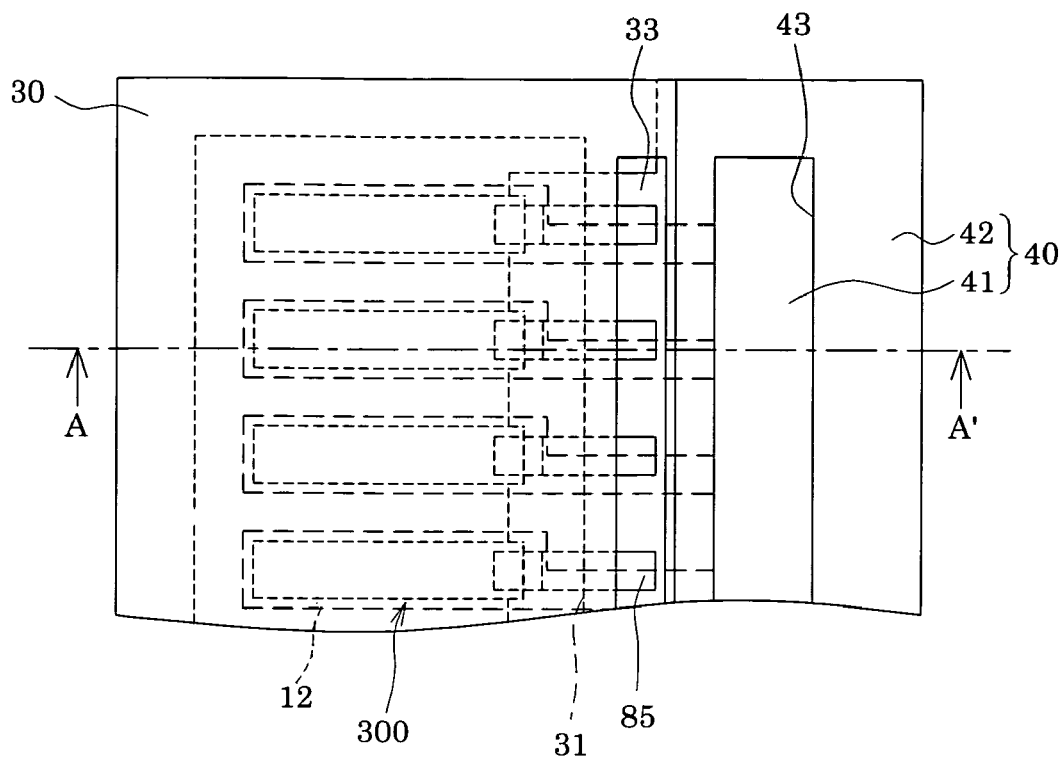
FIGS. 2A and 2B are a plane view and a cross-sectional view, respectively, of the liquid-jet head according to one embodiment.
Figure 2B:
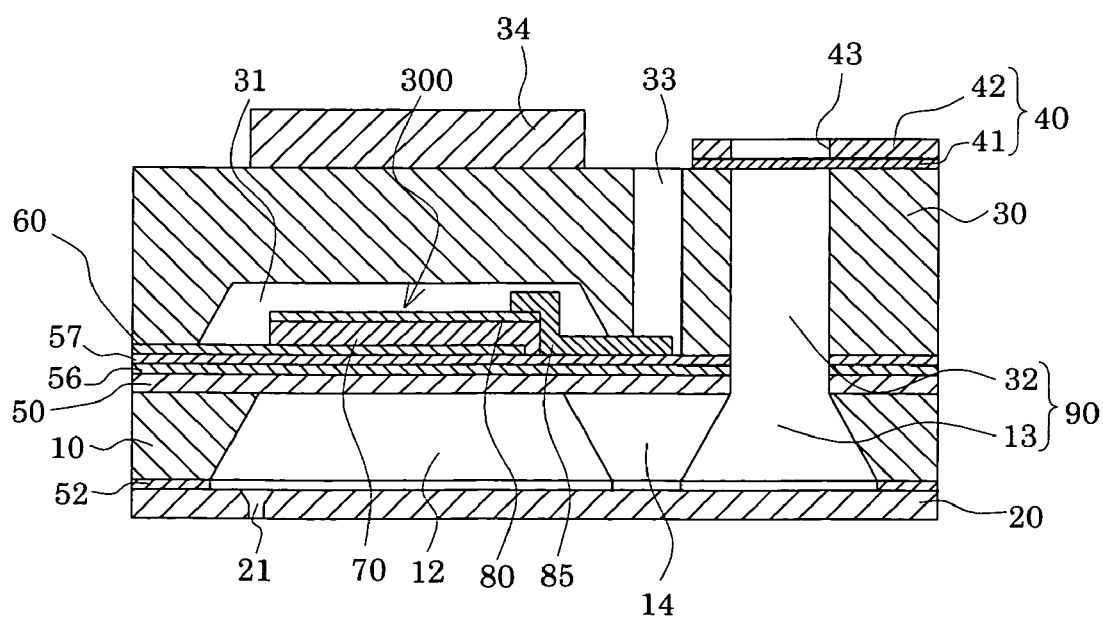

FIG. 1 is an exploded disassembled perspective view showing an ink-jet recording head which is one example of a liquid-jet head according to one embodiment. FIGS. 2A and 2B are a plane view of FIG. 1, and a cross-sectional view taken along an A-A' line thereof, respectively.

A passage-forming substrate 10 is made of single crystal silicon having the (110) plane orientation in this embodiment, and on a surface of one side thereof, an elastic film 50 having a thickness between 0.5 and 2 μm is formed. Note that, in this embodiment, this elastic film 50 is an amorphous (non-crystal) film made of silicon oxide formed by thermally oxidizing the passage-forming substrate 10 which is a single crystal silicon substrate, and the elastic film 50 has a smooth surface state directly maintaining a surface state of the passage-forming substrate 10.

On this passage-forming substrate 10, by anisotropically etching the single crystal silicon substrate from a surface of one side thereof, pressure generating chambers 12 divided by a plurality of compartment walls 11 are provided in parallel to one another in a width direction of the pressure generating chambers 12. Additionally, to an outside of the pressure generating chambers 12 in a longitudinal direction thereof, there is formed a communicating portion 13 to be communicated with a reservoir portion 32 of an after-mentioned protective plate 30. Additionally, the communicating portion 13 is communicated with each of the pressure generating chambers 12 in one end portion thereof through ink supply paths 14. Note that the communicating portion 13 constitutes a part of a reservoir by communicating with the reservoir portion of the after-mentioned protective plate, the reservoir becoming a common ink chamber of each of the pressure generating chambers 12. The ink supply path 14 is formed in a narrower width than the pressure generating chamber 12, thereby retaining a passage resistance of ink flowing into the pressure chamber 12 from the communicating portion 13 at a constant level. Moreover, a nozzle plate 20 having nozzle orifices 21 drilled therein is stuck to an orifice surface side of the passage-forming substrate 10 with a mask film 52 interposed in between, the nozzle orifices 21 communicating with each of the pressure generating chambers 12 on the opposite side of the ink supply paths 14.

On the elastic film 50 on a side reverse to the orifice surface side of the passage-forming substrate 10, a buffer layer 56, a base layer 57 made of lanthanum nickel oxide (LNO), a lower electrode 60 made of platinum (Pt), a piezoelectric layer 70, and an upper electrode 80 are sequentially formed.

Here, a piezoelectric element 300 is made of a part including the lower electrode 60, the piezoelectric layer 70, and the upper electrode 80. The piezoelectric element is composed of the lower electrode 60, the piezoelectric layer 70, and the upper electrode 80 which have thicknesses of, for example, about 0.2 μm, about 1 μm, and about 0.05 μm, respectively. In general, any one of the two electrodes is set as a common electrode, and the other one of the two, and the piezoelectric layer 70 are patterned in a fashion corresponding to each of the respective pressure generating chambers 12 to form the piezoelectric element 300. In addition, here, a part where a piezoelectric distortion is generated by applying a voltage to the both electrodes is called a piezoelectric active portion, the part being composed of any patterned one of the two electrodes as well as the piezoelectric layer 70. In this embodiment, the lower electrode 60 is set as a common electrode of the piezoelectric elements 300, and the upper electrodes 80 are set as individual electrodes of the piezoelectric elements 300. However, there is no problem if this configuration is reversed for convenience of a driver circuit and wiring. In any of the cases, the piezoelectric active portion is formed with respect to each of the pressure generating chambers. Additionally, here, a combination of the piezoelectric elements 300 and a vibration plate in which displacement occurs by being driven by these piezoelectric elements 300 is called a piezoelectric actuator.

In this embodiment, as the buffer layer 56, it suffices to use a layer which effectively prevents diffusion, to the elastic film 50, of metal eluted from the piezoelectric elements 300, and which has a sufficient rigidity to be suitably used as a vibration plate. Also, as the buffer layer 56, it is preferable to use a layer having favorable adherence to the base layer 57. Furthermore, it is preferable that the buffer layer 56 should not influence a crystal orientation of the base layer 57 formed on the buffer layer 56. As long as the above-referenced conditions are satisfied, it suffices to use any one of amorphous (non-crystal) and crystal. In this embodiment, zirconium oxide ($ZrO_2$) is used as the buffer layer 56. Note that the buffer layer 56 is not limited to zirconium oxide ($ZrO_2$), and it suffices as long as the buffer layer 56 is a layer having the above-referenced functions. Additionally, the buffer layer 56 is not limited to a single layer, and the buffer layer 56 may have a two-layered structure composed of a layer made of zirconium oxide ($ZrO_2$), and a layer for enhancing adherence to the base layer 57.

In this embodiment, zirconium oxide ($ZrO_2$) as the buffer layer 56 effectively prevents diffusion, to the elastic film 50, of metal eluted from the piezoelectric layer 70, the metal being lead in particular.

In the invention, the base layer made of lanthanum nickel oxide (LNO) has a thickness of, for example, 60 nm, and it suffices as long as the thickness of the base layer 57 is within a degree where the base layer 57 becomes crystals having no fluctuations in a polarization direction. Lanthanum nickel oxide (LNO) has a property to freely grow even on crystals having the (111) orientation, and to grow in the (100) orientation. By using this property, even though the buffer layer 56 has the (111) orientation, the base layer 57 made of lanthanum nickel oxide (LNO) freely grows and becomes crystals in the (100) orientation in a state where there are small fluctuations in orientation. Note that, if a surface of the elastic film 50 is smooth, a surface of the buffer layer 56 also becomes smooth, and the base layer 57 which freely grows on the buffer layer 56 become crystals having remarkably small fluctuations in orientation.

Furthermore, a lattice constant of lanthanum nickel oxide (LNO) is very close to a lattice constant 3.861 Å of platinum (Pt), and is 3.923 Å. For this reason, the base layer 57 can grow the lower electrode 60 formed thereon and made of platinum (Pt) in a state where crystals of the lower electrode 60 are undistorted. Thus, the base layer 57 is provided for the purpose of forming the crystals with small fluctuations and without distortion by controlling the lower electrode 60 to have the (100) orientation. Additionally, lanthanum nickel oxide (LNO) has conductivity, thereby functioning also as a part of the lower electrode.

In this embodiment, the lower electrode 60 is made of platinum (Pt), and is epitaxially grown on the base layer 57 made of lanthanum nickel oxide (LNO), the base layer 57 having remarkably small fluctuations in orientation, and the base layer having the (100) orientation with a lattice constant close to that of the lower electrode 60. Thereby, the lower electrode 60 is controlled to be substantially completely oriented in the (100) orientation, and becomes crystals having remarkably small fluctuations and being undistorted.

While the piezoelectric layer 70 formed on the lower electrode 60 as described above is set to be lead zirconate titanate (PZT) in this embodiment, the piezoelectric layer 70 epitaxially grows by receiving influence of the plane orientation of the lower electrode 60, and becomes a layer of crystal systems where a crystal system of at least one kind selected from the group consisting of a tetragonal system, a monoclinic system and a rhombohedral system dominates the other crystal systems. Thereby, the plane orientation of the piezoelectric layer 70 becomes the (100) orientation. That is, the piezoelectric layer 70 is not formed by free growth like the piezoelectric layer provided on the lower electrode with titanium interposed in between as has been cited in the related art, but is subjected to orientation control by receiving influence of the plane orientation of the lower electrode 60. Therefore, the piezoelectric layer 70 is preferentially oriented in the (100) orientation in a state where fluctuations in orientation thereof are remarkably small.

As the piezoelectric layer 70, other than lead zirconate titanate (PZT), any one of a single crystal ferroelectric thin film and a polycrystal ferroelectric thin film can be listed. The single crystal ferroelectric thin film is any one kind selected from barium titanate ($BaTiO_3$), barium strontium titanate (($Ba,Sr)TiO_3$), a solid solution of lead magnesium niobate (PMN) and lead titanate (PT), and a relaxor ferroelectric. The polycrystal ferroelectric thin film has no in-plane orientation and is oriented in a direction normal to the substrate (in a columnar reference direction). The single crystal ferroelectric thin film mentioned here refers to a state where there is no grain boundaries between crystals. The polycrystal ferroelectric thin film having no in-plane orientation and being oriented in the direction normal to the substrate (in the columnar reference direction) mentioned here refers to a state where: crystals each formed in a columnar shape with respect to the substrate densely aggregate, and each of the crystals has no in-plane orientation and is oriented in the direction normal to the substrate (in the columnar reference direction).

Here, as the solid solution of lead magnesium niobate and lead titanate, there can be listed: $Pb(Mg_{1/3}Nb_{2/3})O_3$—$PbTiO_3$ [PMN-PT] and the like. Furthermore, as the solid solution of lead zincate niobate and lead titanate, there can be listed: $Pb(Zn_{1/3}Nb_{2/3})O_3$—$PbTiO_3$ [PZN-PT] and the like.

Additionally, the relaxor ferroelectric refers to one having a Curie temperature at around the room temperature, having a larger dielectric constant than a piezoelectric such as PZT (for example, a dielectric constant not less than 5000), and having a larger electric-field-induced distortion than a piezoelectric such as PZT. For example, while the piezoelectric such as PZT has an electric-field-induced distortion at around 0.3%, the relaxor ferroelectric has an electric-field-induced distortion at around 1.2%. The relaxor ferroelectric as described above is, for example, a relaxor ferroelectric containing lead titanate. As the relaxor ferroelectric, there can be listed, for example, PMN-PT (Pb ($Mg_{1/3} Nb_{2/3}$)$O_3$—$PbTiO_3$), PZN-PT ($Pb(Zn_{1/3}Nb_{2/3})O_3$—$PbTiO_3$), PNN-PT (Pb ($Ni_{1/3}Nb_{2/3}$)$O_3$—$PbTiO_3$), PIN-PT ($Pb(In_{1/2}Nb_{1/2})O_3$—$PbTiO_3$) PST-PT ($Pb(Sc_{1/3}Ta_{2/3})O_3$—$PbTiO_3$), PSN-PT ($Pb(Sc_{1/3}Nb_{2/3})O_3$—$PbTiO_3$) BS-PT ($BiScO_3$-PT), $BiYbO_3$-PT and the like.

Additionally, for example, in a case where PZT is used as the above-referenced piezoelectric ceramic material, it is preferable that, among constituting elements of PZT, a relation of a molar quantity A of Zr and a molar quantity B of Ti should satisfy a predetermined condition which is, for example, a condition "$A/(A+B) \geqq 0.55$". Similarly, in a case where PMN-PT is used as the piezoelectric ceramic material, it is preferable that a relation of a molar quantity C of PMN and a molar quantity D of PT should satisfy a predetermined condition which is, for example, a condition "$0.65 \leqq C/(C+D) \leqq 0.75$". Furthermore, in a case where PZN-PT is used as the piezoelectric ceramic material, it is preferable that a relation of a molar quantity E of PZN and a molar quantity F of PT should satisfy a predetermined condition which is, for example, a condition "$0.90 \leqq E/(E+F) \leqq 0.965$". Note that, by forming the piezoelectric layer 70 of the piezoelectric ceramic material satisfying the above conditions, a crystal structure of the piezoelectric layer 70 becomes one where the rhombohedral system dominates the other crystal systems, whereby piezoelectric characteristics of the piezoelectric layer 70 are substantially enhanced.

The piezoelectric layer 70 is formed by a so-called sol-gel method where a so-called sol, which is obtained by dissolving and dispersing a metal organic matter in a catalyst, is applied and dried to become a gel, and is further sintered at a high temperature. Specifically, the piezoelectric layer 70 having crystals oriented in the same plane orientation as the lower electrode 60 is formed. Obviously, a deposition method for this piezoelectric layer 70 is not limited to the sol-gel method, and the piezoelectric layer 70 may be formed by a sputtering method, an MOD method or the like.

Additionally, for the purpose of epitaxially growing the piezoelectric layer 70 in the same (100) plane orientation as the lower electrode 60 which is a base thereunder, it is preferable that the piezoelectric layer 70 should be formed under a predetermined condition causing a crystal structure and a lattice spacing of the layer to approximate to those of the base thereunder. Moreover, it is preferable that the piezoelectric layer 70 should be formed to have a crystal structure which does not have repulsive force arising from electrostatic interactions between the piezoelectric layer 70 and the surface of the base thereunder.

Incidentally, in this embodiment, the piezoelectric layer 70 is formed by using lead zirconate titanate (PZT) satisfying the condition "$A/(A+B) \geqq 0.55$". Lead zirconate titanate (PZT) becomes a crystal system where the rhombohedral system dominates the other crystal systems, and at the same time, grows into crystals in columnar shapes. This is because, while the crystal system grows into a tetragonal system in an initial phase of crystal growth since a cubic system of the lower electrode 60 and a lattice shape of an interface therebetween become square, and coincide with each other, the crystal system changes into the rhombohedral system as the crystal growth progresses. This is also because the piezoelectric layer 70 can be easily epitaxially grown on the lower electrode 60. The piezoelectric layer 70 in which crystals have been thus epitaxially grown have been crystallized by being subjected to constraint from the lower electrode 60 of the (100) plane orientation which is a base thereunder, thereby having the (100) plane orientation as in the case with the lower electrode 60. Here, lattice constants of lead zirconate titanate (PZT) forming the piezoelectric layer and platinum (Pt) in the A axis are 4.03 Å and 3.923 Å respectively, and are very close to each other. For this reason, the piezoelectric layer 70 also can grow in a state where crystals thereof are undistorted.

Incidentally, under a condition of $0.55 > A/(A+B) \geqq 0.50$, lead zirconate titanate (PZT) becomes a crystal system where the monoclinic system and the rhombohedral system dominate the other crystal systems. Under a condition of $A/(A+B) < 0.50$, lead zirconate titanate (PZT) becomes a crystal system where the tetragonal system dominates the other crystal systems. In this embodiment, any one of these conditions may be selected.

The thus deposited piezoelectric layer 70 is preferentially oriented in the (100) orientation constrained by the (100) orientation of the lower electrode 60, and preferably has crystals being in columnar shapes. Incidentally, "being preferentially oriented" means being in a state where: oriented directions of the crystals are not disorderly, and a particular crystal plane is oriented in a substantially fixed direction. Additionally, a thin film where crystals are in columnar shapes means a state where: a thin film is formed by having crystals aggregating over plane directions in a state where the crystals in substantially columnar shapes have their central axes substantially coinciding with one another in a thickness direction. It goes without saying that the thin film may be formed of crystals which are preferentially oriented and are shaped as grains. Incidentally, a thickness of the piezoelectric layer 70 thus manufactured in a thin-film process is 0.2 to 5 µm in general.

Additionally, particularly, the piezoelectric layer 70, which is made of any one of the single crystal ferroelectric thin film made of a ferroelectric material such as barium titanate (Ba-TiO$_3$), barium strontium titanate ((Ba,Sr)TiO$_3$) or lead zirconate titanate (Pb(Zr,Ti)O$_3$), and the polycrystal ferroelectric thin film having no in-plane orientation and being oriented in the direction normal to the substrate, may have point defects. These point defects can be formed by, for example, an ion implantation method. That is, the piezoelectric layer 70 comes to have the point defects formed by implanting Ar ions, or ions of at least any one element selected from the VIII B group, such as Fe ions, Co ions, Ni ions and Cr ions.

The thus configured piezoelectric layer 70 has the point defects formed by ion implantation, and thereby shows an enormous electrostriction effect. Accordingly, a large distortion can be obtained with a small driving voltage. Particularly in a case where the piezoelectric layer 70 is configured to be the single crystal ferroelectric thin film having the (100) plane orientation, the point defects can be relatively easily formed by a relatively convenient method which is ion implantation, whereby it is possible to cause the piezoelectric layer 70 to have enormous electrostriction.

Though a method of forming the point defects by ion implantation is not particularly limited, the formation is carried out, for example, in a manner that: after at least one element from the VIII B group consisting of Fe, Co, Ni, Cr and the like is ionized and converted into ions by means of an ionization source, an energy is given to these ions by using a charged particle accelerator, and thereafter, a surface of the piezoelectric layer 70 is sputtered. Thereby, the ions intrude inside the piezoelectric layer 70 due to implantation impacts, come to rest by losing an energy due to collision with atoms inside the layer, and form the point defects by being doped. Note that, in ion implantation of Ar ions, an electron hole is formed by the ion implantation, and thereby becomes the point defects, and Ar ions come to be contained in the other parts. Note that Ar ions and ions of at least any one element selected from the VIII B group, such as Fe ions, Co ions, Ni ions or Cr ions, may be implanted together. Additionally, a quantity of ions subjected to ion implantation is not particularly limited as long as the quantity makes it possible to form the point defects and thereby obtain an enormous electrostriction effect. However, if the quantity is too large, the crystal system is changed. For this reason, it is favorable that a minute quantity of ions which is, for example, not more than 0.1% should be implanted. Moreover, in the ion implantation, it is preferable that ions should be implanted in an entirety of the piezoelectric layer 70, i.e., implanted uniformly both in plane directions and in a thickness direction, by controlling drive of the charged particle accelerator.

Additionally, in order to diffuse the point defects in a stable position, it is preferable to apply an aging treatment to the piezoelectric layer 70. Here, aging means retaining the piezoelectric layer 70 at a constant temperature.

On the other hand, for the upper electrodes 80, for example, iridium and the like are used, and lead electrodes 85, which is made of gold (Au) and the like, are respectively connected to these upper electrodes 80. These lead electrodes 85 are extended out from vicinities of longitudinal end portions of the respective piezoelectric elements 300, and are respectively extended on regions of the elastic film 50 to be connected to an after-mentioned driver IC, the regions corresponding to the ink supply paths 14.

Note that, onto one side of the passage-forming substrate 10, a protective plate 30, which includes piezoelectric element holding portions 31 securing spaces which are large enough not to disturb movements of the respective piezoelectric elements 300, is joined, the side being a side on which the respective piezoelectric elements 300 are provided. The piezoelectric elements 300 are respectively formed inside these piezoelectric element holding portions 31. Additionally, on the protective plate 30, a reservoir portion 32, which constitutes at least a part of a reservoir 90 which is common to each of the pressure generating chambers 12, is provided. This reservoir portion 32 is caused to communicate with the communication portion 13 of the passage-forming substrate 10 as has been described above, thereby constituting the reservoir 90.

Furthermore, in a region between the reservoir portion 32 and the piezoelectric element holding portions 31, there is provided a connection hole 33 penetrating this protective plate 30 in a thickness direction thereof. Extremities of the lead electrodes 85 extended from the respective piezoelectric elements 300 are exposed in this connection hole 33. Moreover, a driver IC 34 for driving the piezoelectric elements 300 is mounted on a surface of the protective plate 30, on the opposite side of the piezoelectric element holding portions 31. These lead electrodes 85 are extended from the respective piezoelectric elements 300, are extended to the connection hole 33, and are respectively connected to the driver IC 34, for example, via connecting wirings formed of wire bonding and the like, which are not illustrated.

Onto the protective plate 30, a compliance plate 40 composed of a sealing film 41 and a fixing plate 42 is joined. Here, the sealing film 41 is made of a material which is low in stiffness and which has flexibility (for example, a polyphenylene sulfide (PPS) film having a thickness of 6 µm). On the other hand, the fixing plate 42 is made of a hard material such as metal (for example, stainless steel (SUS) having a thickness of 30 µm, or the like). A region of this fixing plate 42 facing the reservoir 90 is completely removed in a thickness direction thereof, thereby forming an opening portion 43. Accordingly, one end of the reservoir 90 is sealed only with the sealing film 41 having flexibility.

Incidentally, in the inkjet recording head of this embodiment described above, inks are taken in from unillustrated external ink supplying means, and the inside thereof from the reservoir 90 to the nozzle orifices 21 is filled with the ink. Then, according to a recording signal from an unillustrated driver circuit, a voltage is applied between the lower electrode film 60 and each of the upper electrodes 80 corresponding to the respective pressure generating chambers 12, whereby the elastic film 50, the buffer layer 56, the base layer 57, the lower electrode 60, and the piezoelectric layer 70 undergo flexural deformation. Thereby, a pressure in each of the pressure generating chambers 12 is increased, and ink droplets are ejected from the nozzle orifices 21.

Figure 3A:
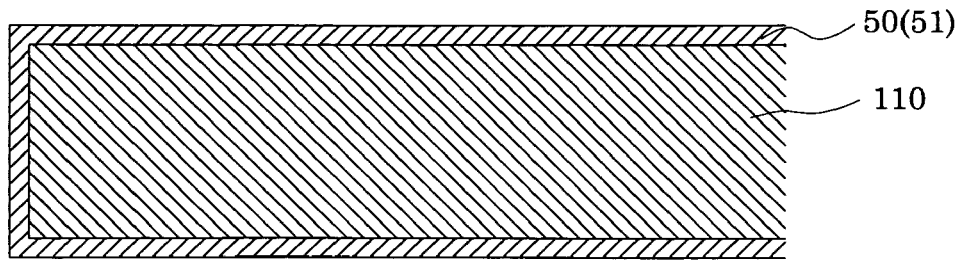
FIGS. 3A to 3D are cross-sectional views showing manufacturing steps for the liquid-jet head according to the one embodiment.

Hereafter, with reference to FIGS. 3A to 6B, a method of manufacturing the above described ink-jet recording head will be described. Note that FIGS. 3A to 6B are cross-sectional views of the pressure-generating chamber 12, which are taken along a longitudinal direction thereof. First, as shown in FIG. 3A, a passage-forming substrate producing wafer 110, which is a silicon wafer, is thermally oxidized in a diffusion furnace at about 1100° C., whereby a silicon dioxide film 51 constituting the elastic film 50 is formed on a surface thereof. Note that, as has been described above, this silicon dioxide film 51 is an amorphous film. Additionally, in this embodiment, a silicon wafer having a relatively thick film thickness of about 625 μm, and being high in stiffness, is used as the passage-forming substrate producing wafer 110.

Figure 3B:
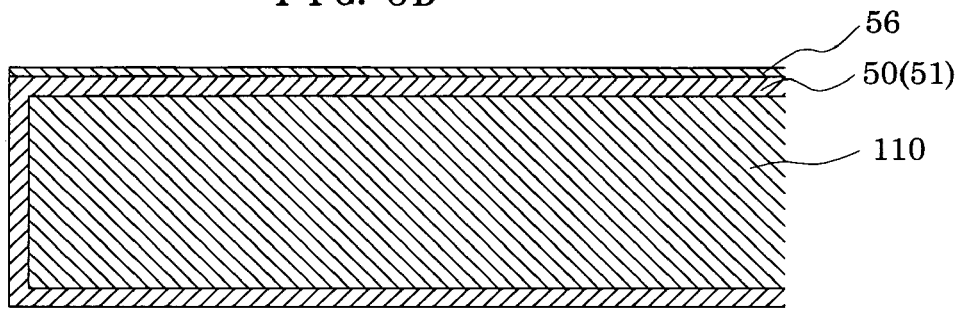

Next, as shown in FIG. 3B, the buffer layer 56 is formed on the elastic film 50. In this embodiment, a zirconium (Zr) layer is formed, by a sputtering method, all over a top surface of the passage-forming substrate producing wafer 110, and thereafter this zirconium layer is thermally oxidized in a diffusion furnace at about 500 to 1200° C. Thereby, the buffer layer 56 made of zirconium oxide ($ZrO_2$) is formed. Note that, although a thickness of this buffer layer 56 is not particularly limited, this embodiment assumes that the thickness is adjusted so as to be about 20 to 500 nm according to stiffness of the vibration plate.

Figure 3C:
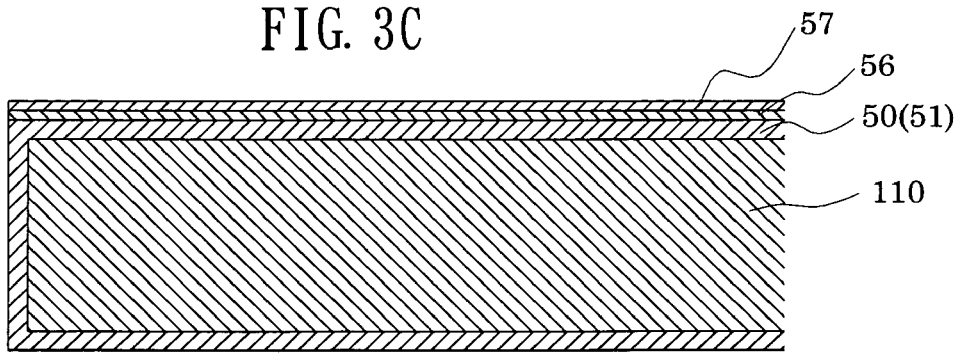

As shown in FIG. 3C, on the formed buffer layer 56, the base layer 57 made of lanthanum nickel oxide (LNO) is formed with a thickness of about 60 nm by a sputtering method. This base layer 57 made of lanthanum nickel oxide (LNO) comes to have the (100) orientation after having freely grown in the (100) orientation and in a state where fluctuations in orientation are remarkably small if a top surface of the elastic film 50 is smooth.

Figure 3D:
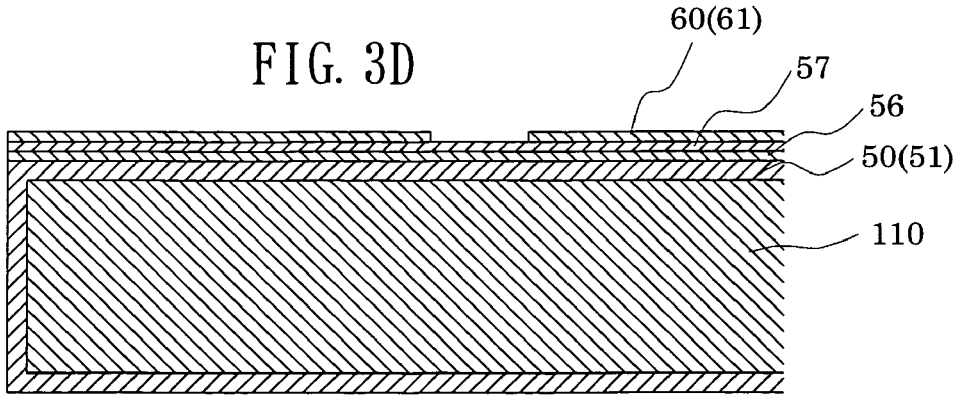

Subsequently, as shown in FIG. 3D, the lower electrode 60 is formed on the base layer 57. In this embodiment, a platinum (Pt) layer 61 is formed, by a sputtering method, all over a top surface of the passage-forming substrate producing wafer 110, and thereafter, the lower electrode 60 is formed by patterning this platinum layer 61 into a predetermined shape. As has been described above, the thus formed lower electrode 60 epitaxially grows on the base layer 57, whereby the lower electrode 60 comes to have the (100) orientation by being subjected to orientation control, and crystals thereof are formed in a state where fluctuations of the crystals are remarkably small in a polarization direction.

Figure 4A:
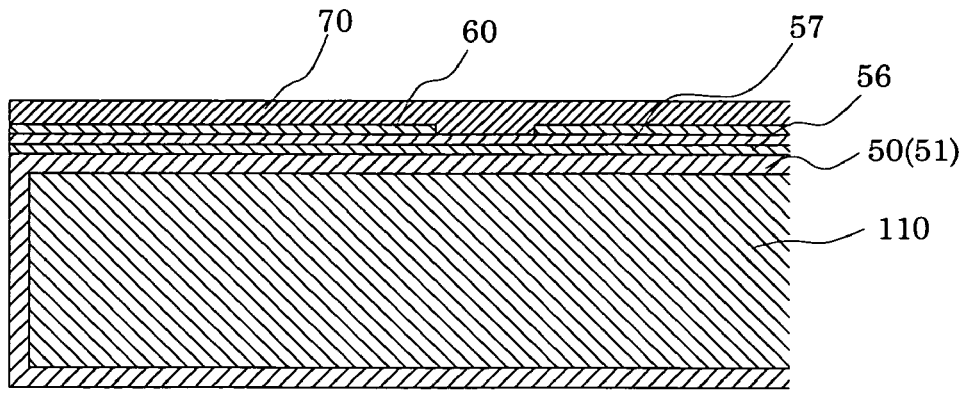
FIGS. 4A to 4C are cross-sectional views showing manufacturing steps for the liquid-jet head according to one embodiment.

Next, as shown in FIG. 4A, on this lower electrode 60, the piezoelectric layer 70 made of lead zirconate titanate (PZT) is formed. In this embodiment, the piezoelectric layer 70 is formed by a so-called sol-gel method where the piezoelectric layer 70 made of a metal oxide is obtained in a manner that a so-called sol, which is obtained by dissolving and dispersing a metal organic matter in a catalyst, is applied and dried to become a gel, and is further sintered at a high temperature. Here, the piezoelectric layer 70 is crystallized by being subjected to constraint from the lower electrode 60. As in the case with the lower electrode 60, crystals of the formed piezoelectric layer 70 are oriented in the plane orientation (100), and are formed in a state where fluctuations thereof are remarkably small in a polarization direction.

Note that, although the piezoelectric layer 70 is configured to be deposited by the sol-gel method in this embodiment, a method of depositing the piezoelectric layer 70 is not particularly limited. For example, a sputtering method, an MOCVD (metal organic chemical vapor deposition) method, an MOD method, and the like may be used.

Figure 4B:
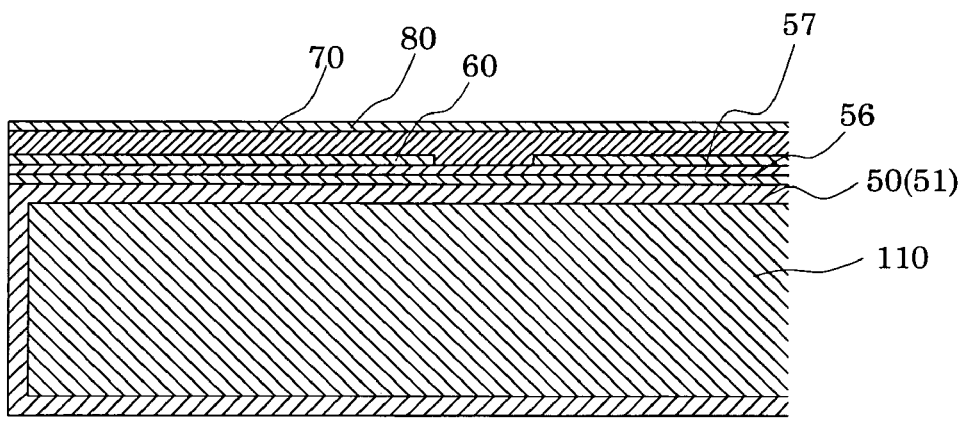
Figure 4C:
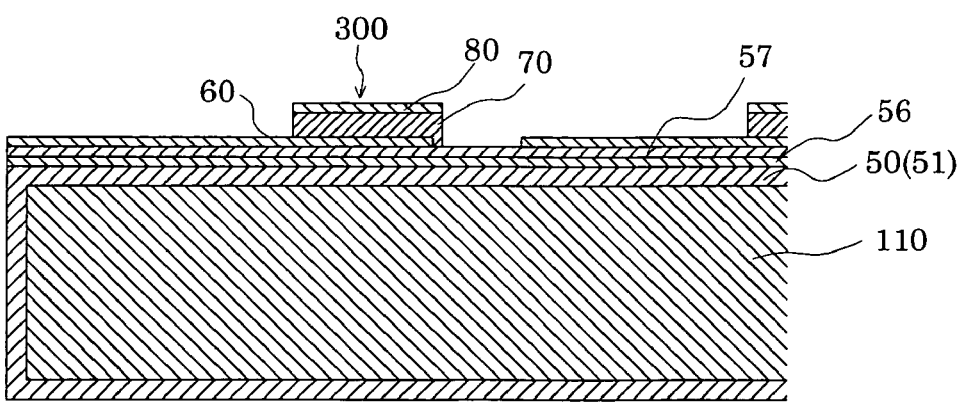

Additionally, after the piezoelectric layer 70 is thus formed, as shown in FIG. 4B, the upper electrode 80 made of, for example, iridium is formed, by a sputtering method, all over a top surface of the passage-forming substrate producing wafer 110. Subsequently, as shown in FIG. 4C, the piezoelectric elements 300 are formed by patterning the piezoelectric layer 70 and the upper electrode 80 in regions facing the respective pressure generating chambers.

Figure 5A:
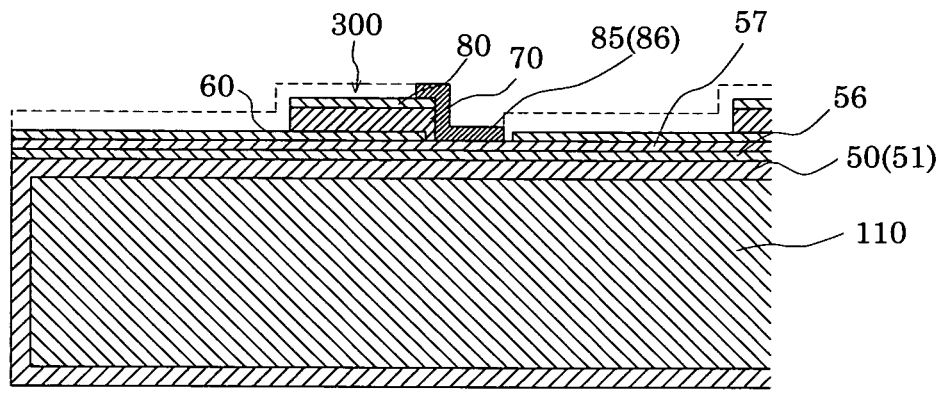
FIGS. 5A to 5C are cross-sectional views showing manufacturing steps for the liquid-jet head according to one embodiment.

Subsequently, as shown in FIG. 5A, a metal layer 86 made of, for example, gold (Au) is formed, by a sputtering method, all over a top surface of the passage-forming substrate producing wafer 110. Thereafter, the lead electrodes 85 are formed by patterning this metal layer 86 with respect to each of the piezoelectric elements 300.

Figure 5B:
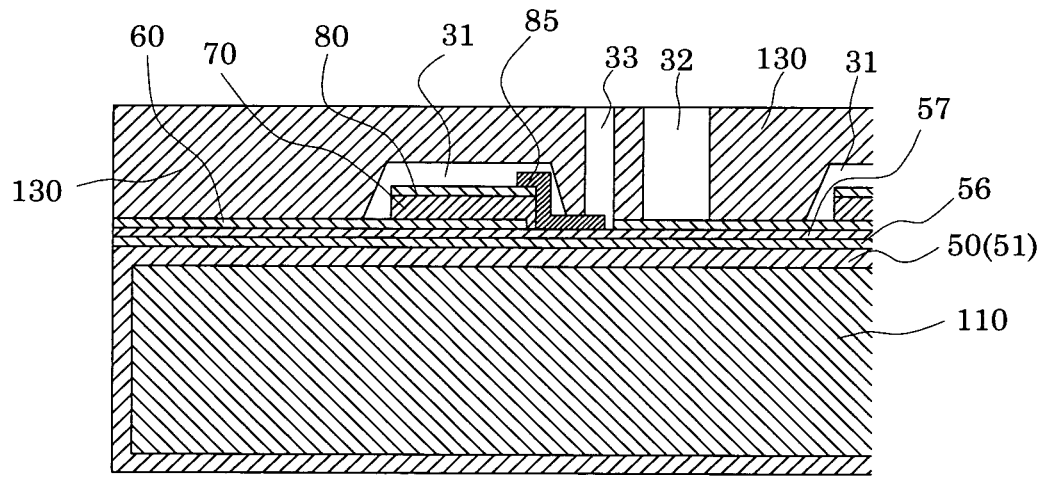

Next, as shown in FIG. 5B, a protective plate producing wafer 130, which is made of, for example, a silicon wafer with a thickness of about 400 μm and which is intended to be the plurality of protective plates 30, is joined onto a side of the passage-forming substrate producing wafer 110 on which the piezoelectric elements 300 are provided.

Figure 5C:
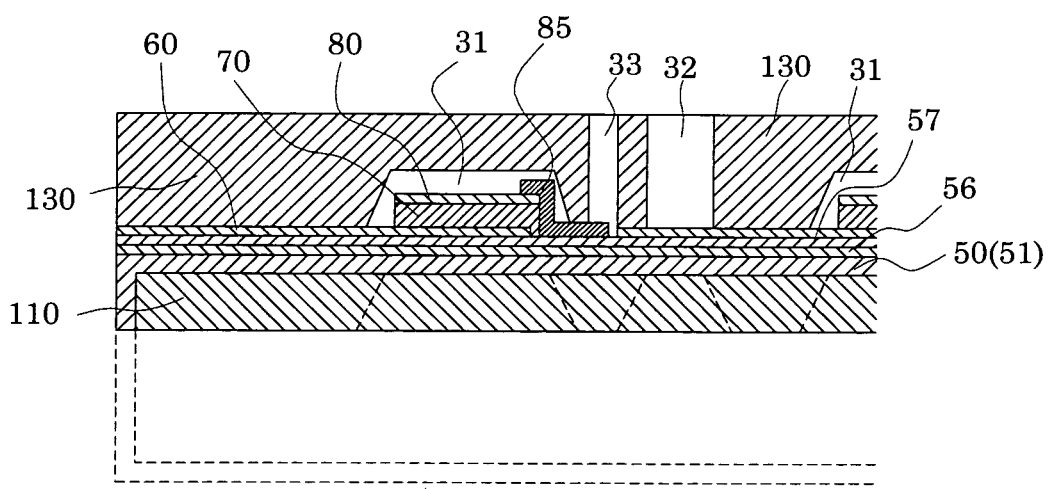

Subsequently, as shown in FIG. 5C, after the passage-forming substrate producing wafer 110 is ground until obtaining a certain thickness, the passage-forming substrate producing wafer 110 is formed into a predetermined thickness by further wet-etching it with HF—$HNO_3$.

Figure 6A:
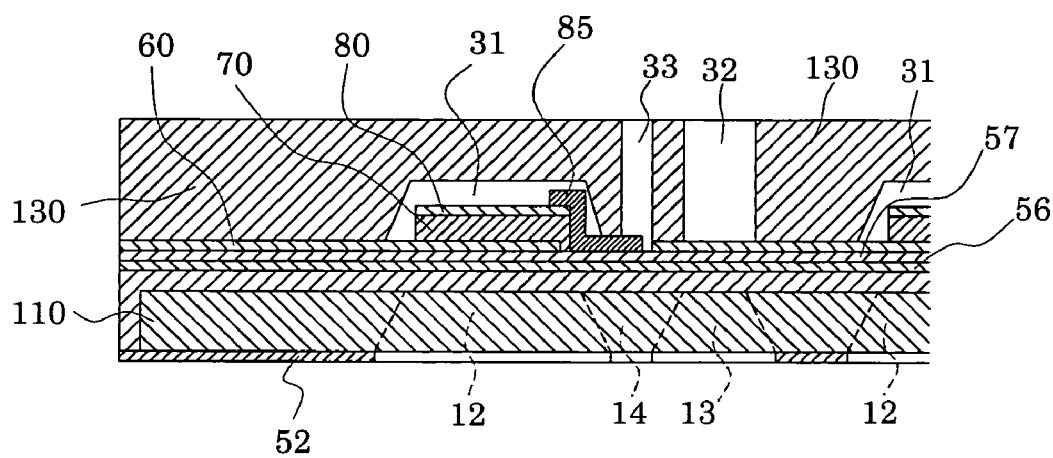
FIGS. 6A and 6B are cross-sectional views showing manufacturing steps for the liquid-jet head according to one embodiment.
Figure 6B:
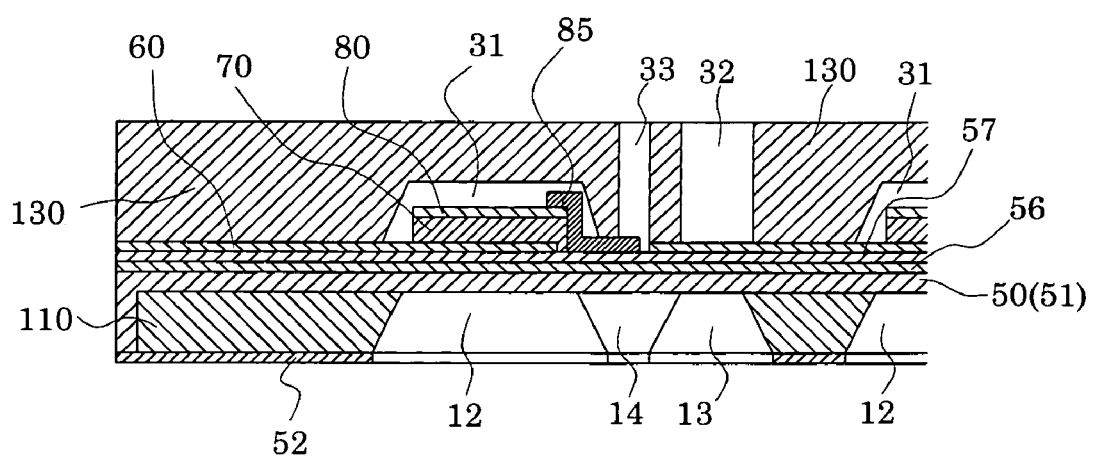

Subsequently, as shown in FIG. 6A, the mask film 52 made of, for example, silicon nitride (SiN) is newly formed on the passage-forming substrate producing wafer 110, and is patterned into a predetermined shape. Then, the pressure generating chambers 12, the communication portion 13, the ink supply paths 14 and the like are formed in the passage-forming substrate producing wafer 110, as shown in FIG. 6B, by anisotropically etching the passage-forming substrate producing wafer 110 through this mask film 52.

Incidentally, what follows is to remove unnecessary parts in peripheral edge portions of the passage-forming substrate producing wafer 110 and the protective plate producing wafer 130 by cutting them off by, for example, dicing, or the like. Thereafter, a nozzle plate 20 having nozzle orifices 21 drilled therein is joined onto a surface of the passage-forming substrate producing wafer 110 on the opposite side of the protective plate producing wafer 130, and the compliance plate 40 is joined to the protective plate producing wafer 130. Subsequently, an ink-jet recording head is completed by dividing the passage-forming substrate producing wafer 110 and the like into one-chip-size passage-forming substrates 10 and the like as shown in FIG. 1.

Figure 7:
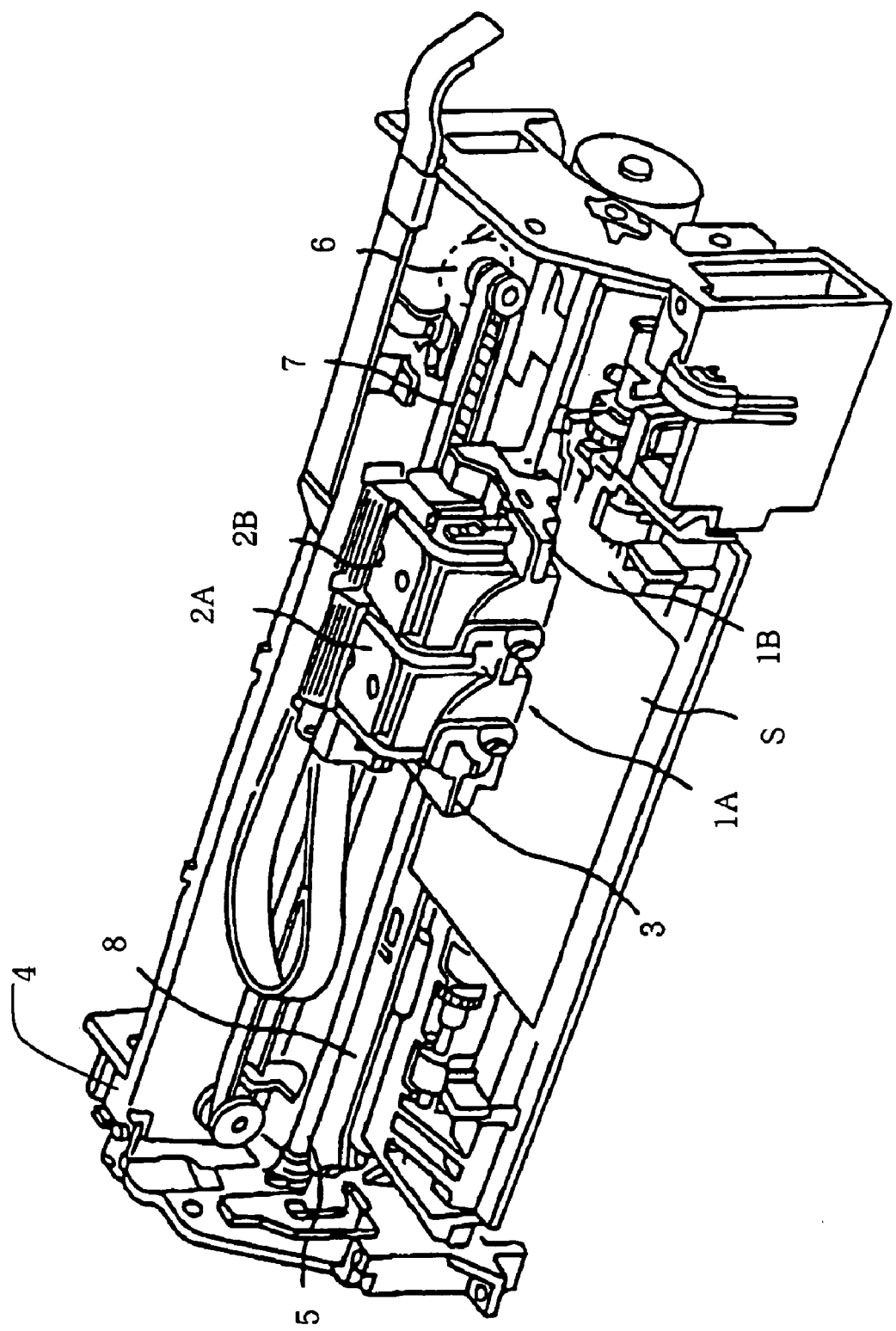
FIG. 7 is a schematic exploded perspective view of the liquid-jet apparatus according to one embodiment.

Furthermore, the ink-jet recording head as described above constitutes a part of a recording head unit including ink passages communicating with an ink cartridge or the like, and is mounted on an ink-jet recording apparatus. FIG. 7 is a schematic exploded perspective view showing the ink jet recording apparatus.

As shown in FIG. 7, in recording head units 1A and 1B respectively having ink jet recording heads, cartridges 2A and 2B constituting ink supply means are detachably provided respectively. A carriage 3 on which the recording head units 1A and 1B are mounted is axially movably provided on a carriage shaft 5 attached to an apparatus body 4. These recording head units 1A and 1B are configured as, for example, ones ejecting a black ink composition and a color ink composition, respectively.

A driving force of a drive motor 6 is transmitted to the carriage 3 by means of a plurality of unillustrated gears and a timing belt 7, thereby causing the carriage 3, on which the recording head units 1A and 1B are mounted, to move along the carriage shaft 5. On the other hand, a platen 8 is provided in the apparatus body 4 in a way that the platen 8 extends along the carriage shaft 5. A recording sheet S, which is a recording medium such as paper, fed by an unillustated paper feed roller and the like is caused to be carried on the platen 8.

Although one embodiment of the invention has been described, basic configurations of the invention are not limited to the above described embodiment. The invention is broadly aimed for liquid-jet heads in general, and is also applicable to liquid-jet heads which eject liquid other than ink. These liquid-jet heads are, for example, various kinds of recording heads used in image recording apparatuses such as a printer; a color-material-jet head used for manufacturing color filters for liquid crystal displays; an electrode-material-jet head used for forming electrodes of organic EL displays, FEDs (field emission displays) or the like; and a bio-organic-material-jet head used for manufacturing bio-chips obviously, a liquid-jet apparatus on which any one of the above liquid-jet heads is mounted is not particularly limited. Furthermore, the invention is not limited to an actuator device utilized in a liquid-jet head, but is also applicable to any actuator device mounted on all the other apparatuses. For example, the actuator device is applicable to a sensor and the like in addition to the above described heads.

What is claimed is:

1. An actuator device comprising:
   a layer provided on a single crystal silicon (Si) substrate, and made of silicon dioxide ($SiO_2$);
   at least one buffer layer provided on the layer made of silicon dioxide ($SiO_2$);
   a base layer provided on the buffer layer, and made of lanthanum nickel oxide (LNO) having the (100) plane orientation; and
   a piezoelectric element comprising:
      a lower electrode provided on the base layer, and made of platinum (Pt) having the (100) plane orientation;
      a piezoelectric layer made of a ferroelectric layer whose plane orientation is the (100) orientation, the piezoelectric layer formed on the lower electrode by epitaxial growth where a crystal system of at least one kind selected from a group consisting of a tetragonal system, a monoclinic system and a rhombohedral system dominates the other crystal systems; and
      an upper electrode provided on the piezoelectric layer.

2. The actuator device according to claim 1, wherein the buffer layer is a layer made of at least zirconium oxide ($ZrO_2$).

3. The actuator device according to claim 1, wherein the buffer layer comprises:
   the layer made of zirconium oxide ($ZrO_2$); and
   a layer for enhancing adherence to the base layer.

4. The actuator device according to claim 1, wherein the buffer layer is a layer which prevents lead (Pb) in the piezoelectric layer from being diffused to the silicon dioxide ($SiO_2$).

5. The actuator device according to claim 1, wherein the piezoelectric layer is anyone of a single crystal ferroelectric thin film and a polycrystal ferroelectric thin film having no in-plane orientation and being oriented in a direction normal to the substrate, the single crystal ferroelectric thin film being made of any one kind selected from lead zirconate titanate (PZT), barium titanate ($BaTiO_3$), barium strontium titanate (($Ba,Sr$)$TiO_3$), a solid solution of lead magnesium niobate (PMN) and lead titanate (PT), and a relaxor ferroelectric.

6. The actuator device according to claim 5, wherein any one of the single crystal ferroelectric thin film and the polycrystal ferroelectric thin film has point defects.

7. The actuator device according to claim 1, wherein the single crystal silicon (Si) substrate is a single crystal silicon substrate whose plane orientation is the (110) orientation.

8. A liquid-jet head comprising the actuator device according to claim 1, as a pressure generation means, the pressure generator generating pressures for ejecting liquid in the pressure generating chambers from nozzle orifices.

9. A liquid-jet apparatus comprising the liquid-jet head according to claim 8.

* * * * *